United States Patent [19]

Huang et al.

[11] Patent Number: 5,382,345
[45] Date of Patent: Jan. 17, 1995

[54] APPARATUS FOR SIMULTANEOUSLY COATING A FILM OF MAGNETO-OPTICAL RECORDING MEDIUM ON A PLURALITY OF DISK SUBSTRATES

[75] Inventors: Der-Ray Huang, Hsinchu; Tsai-Chu Hsiao, Chungli; Shiuh Chao, Taipei, all of Taiwan, Prov. of China

[73] Assignees: Industrial Technology Research Institute; National Tsing Hua University, both of Hsinchu, Taiwan, Prov. of China

[21] Appl. No.: 18,043

[22] Filed: Feb. 16, 1993

[51] Int. Cl.[6] ............................................. C23C 14/34
[52] U.S. Cl. ........................ 204/298.27; 204/192.2; 204/298.28
[58] Field of Search ........... 204/192.2, 192.12, 298.27, 204/298.28, 298.23

[56]  References Cited

U.S. PATENT DOCUMENTS

| | | | |
|---|---|---|---|
| 4,790,921 | 12/1988 | Bloomquist et al. | 204/192.12 |
| 4,926,320 | 5/1990 | Yamada et al. | 204/192.2 |
| 4,956,070 | 9/1990 | Nakada et al. | 204/298.18 |
| 5,181,020 | 1/1993 | Furukawa et al. | 340/551 |

FOREIGN PATENT DOCUMENTS 3-100171  4/1991  Japan ........................... 204/298.27

Primary Examiner—Nam Nguyen
Attorney, Agent, or Firm—W. Wayne Liauh

[57] ABSTRACT

An apparatus for coating a magneto-optical recording medium film onto a disk substrate are provided. For proceeding the sputtering processes, a sputtering target containing Tb, Fe, and Co composition is prepared and placed in a sputtering gun which is served as a sputtering source. Facing to the sputtering gun, a clamping mechanism having a plurality of clampers arranged around the clamping mechanism is provided for clamping disk substrate thereon. During sputtering processes, the clamping mechanism is rotated about its axial center, and at the same time each clamper of the clamping mechanism is rotated about its axial center respectively. The clamper is designed in a form of facing the plane of the sputtering gun at a proper tilt angle, preferably 15 degrees, so that the disk substrate may be sputtered with a uniform thickness and composition of magneto-optical recording medium film thereon.

7 Claims, 5 Drawing Sheets

APPARATUS FOR SIMULTANEOUSLY COATING A FILM OF MAGNETO-OPTICAL RECORDING MEDIUM ON A PLURALITY OF DISK SUBSTRATES

BACKGROUND OF THE INVENTION:

The present invention relates to an apparatus for forming a recording medium layer on a disk, and more particularly to an apparatus for simultaneously coating a uniform thickness and composition of magneto-optical recording medium film onto several magneto-optical disks.

It has been noted that a magneto-optical recording medium (such as a magneto-optical disk) has been used as a good recording medium for reading and writing digital information. Because the magneto-optical recording medium is rewritable and has advantages of high density and reliability, the magneto-optical recording medium has become a commercial product in the market.

In the processes of making a conventional magneto-optical disk, an optical disk substrate has to be provided first, and it is usually made of polycarbonate; then, the optical disk substrate is coated with an under-coat, such as a lamina of aluminum nitride, which is usually done by using an aluminum sputtering target as a sputtering source; then, a magneto-optical recording medium is evenly containing alloy as transition metal and rare earth elements. On the surface of the magneto-optical recording medium, a cover-coat is coated by using the same material and method as that of coating the under-coat. Finally, a reflecting lamina (such as aluminum) and a protective plastic layer are coated in sequence onto the surface of the over-coat to completely the whole processes. Normally, the prepared product above is tested by means of a known method of dynamic read/write test to assure the quality thereof.

In the aforesaid processes of coating a magneto-optical recording medium film onto the disk substrate, one of the most important steps is the process of forming the magneto-optical recording medium layer on the disk substrate. It is found that the materials of the alloy of transition metal and rare earth elements are preferable for the recording medium film. In the conventional method, a single disk substrate is set opposite to a sputtering target containing rare earth and transition metal element alloy in order to coat a magneto-optical recording medium film onto the disk substrate. During the sputtering process, the scattering flux of the elements of the sputtering target in sputtering area is not uniform. As a result, the composition of the alloy layer coated on the substrate is not uniform. In order to maintain the uniformity of the composition and thickness of the magneto-optical recording medium film on the substrate, it is preferable to use only the center area of the sputtering target as an effective sputtering area. Under this restriction, the manufacturer must utilize a sputtering target with a larger diameter than the diameter of the substrate disk so as to cover the surface of the disk substrate within the effective sputtering area of the sputtering target.

According to the conventional method, the cost of making such a magneto-optical disk would be higher because that sputtering target contains more terbium and needs a larger size covering larger sputtering area to meet the actual requirements. Furthermore, since only one disk substrate is set opposite to one sputtering target, so only one optical substrate disk can be processed each time, and therefore it wastes much time and manpower.

SUMMARY OF THE INVENTION

In view of the drawbacks of the prior art for forming a magneto-optical recording medium film onto a magneto-optical disk substrate, the inventors have developed a device to improve the manufacturing process and to elevate the quality of such products.

Consequently, the primary object of the present invention is to provide an apparatus for sputtering a magneto-optical recording medium film onto a disk substrate by using a magneto-optical recording medium sputtering target with a smaller diameter. In the preferred embodiment of the present invention, the sputtering target is set with respect to the disk substrate to be sputtered at a proper tilt angle, preferably 15 degrees so as to form a uniform thickness and composition of magneto-optical recording medium film onto the disk substrate.

Another object of the present invention is to provide a sputtering target containing less quantity of recording materials so as to reduce the manufacturing cost, and also to assure an excellent quality of the magneto-optical recording medium coating.

The other objects and features of the invention will become more apparent from the following description taken in connection with the accompanying drawings.

DETAILED DESCRIPTION OF THE INVENTION

Figure 1A:
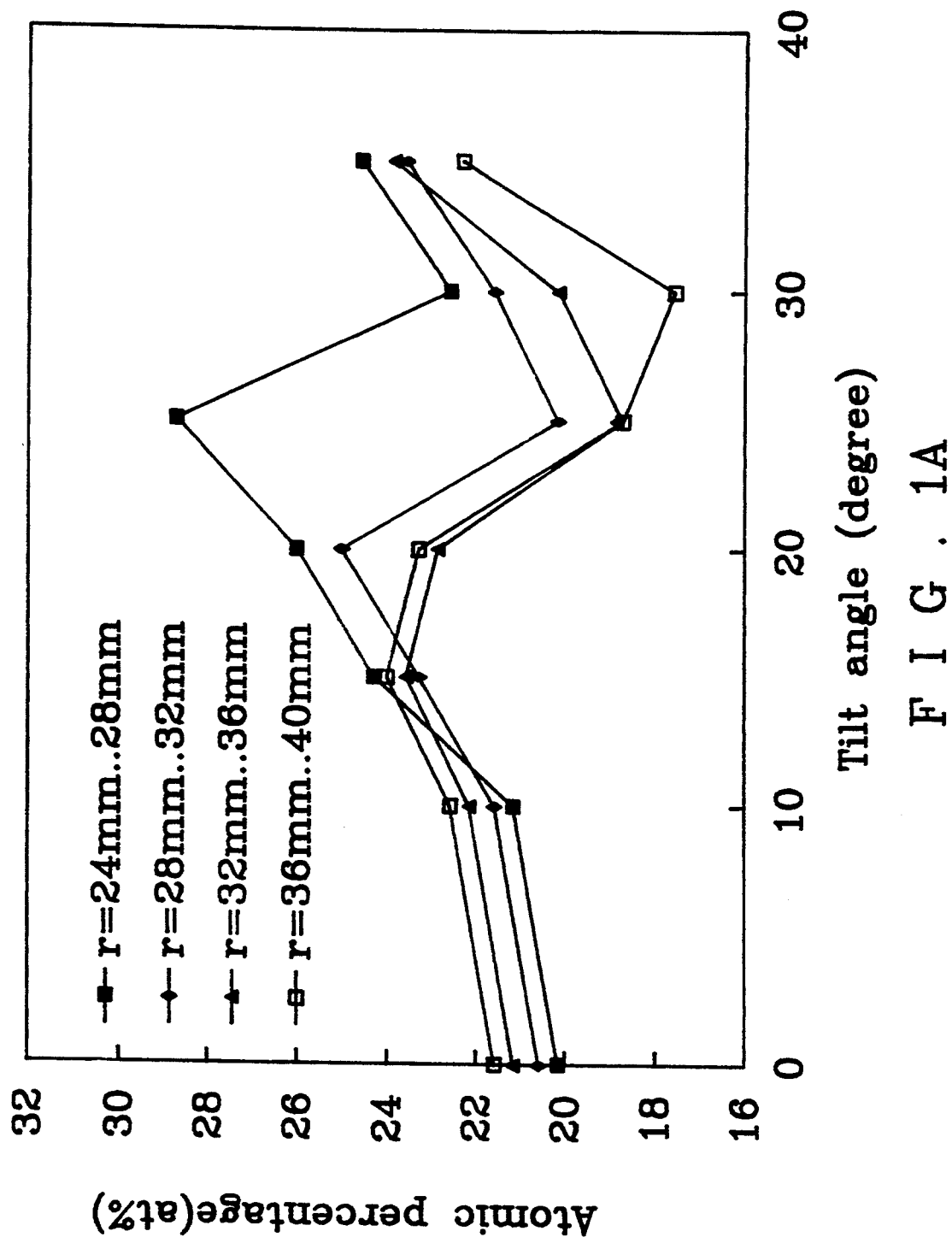
FIG. 1a is a graph depicting the average composition distributions of the element Tb coated at different radiuses on the disk substrate at different sputtering tilt angles.

Referring now to FIG. 1a, which is a graph depicting the different distribution of the element Tb coated at different radius on the disk substrate at different sputtering tilt angles. The distributions of the coated element Tb are measured by Inductive Coupled Plasma Method from the different radiuses 24 mm-28 mm, 28 mm-32 mm, 32 mm-36 mm, and 36 mm-40 mm along the inner radius to the outer radius of the disk substrate respectively. In the drawing, the X-axis represents the sputtering tilt angle, while the Y-axis represents the atomic percentage of the element Tb. The distribution of the element coated on the substrate varies with the sputtering tilt angle during sputtering operation.

Figure 1B:
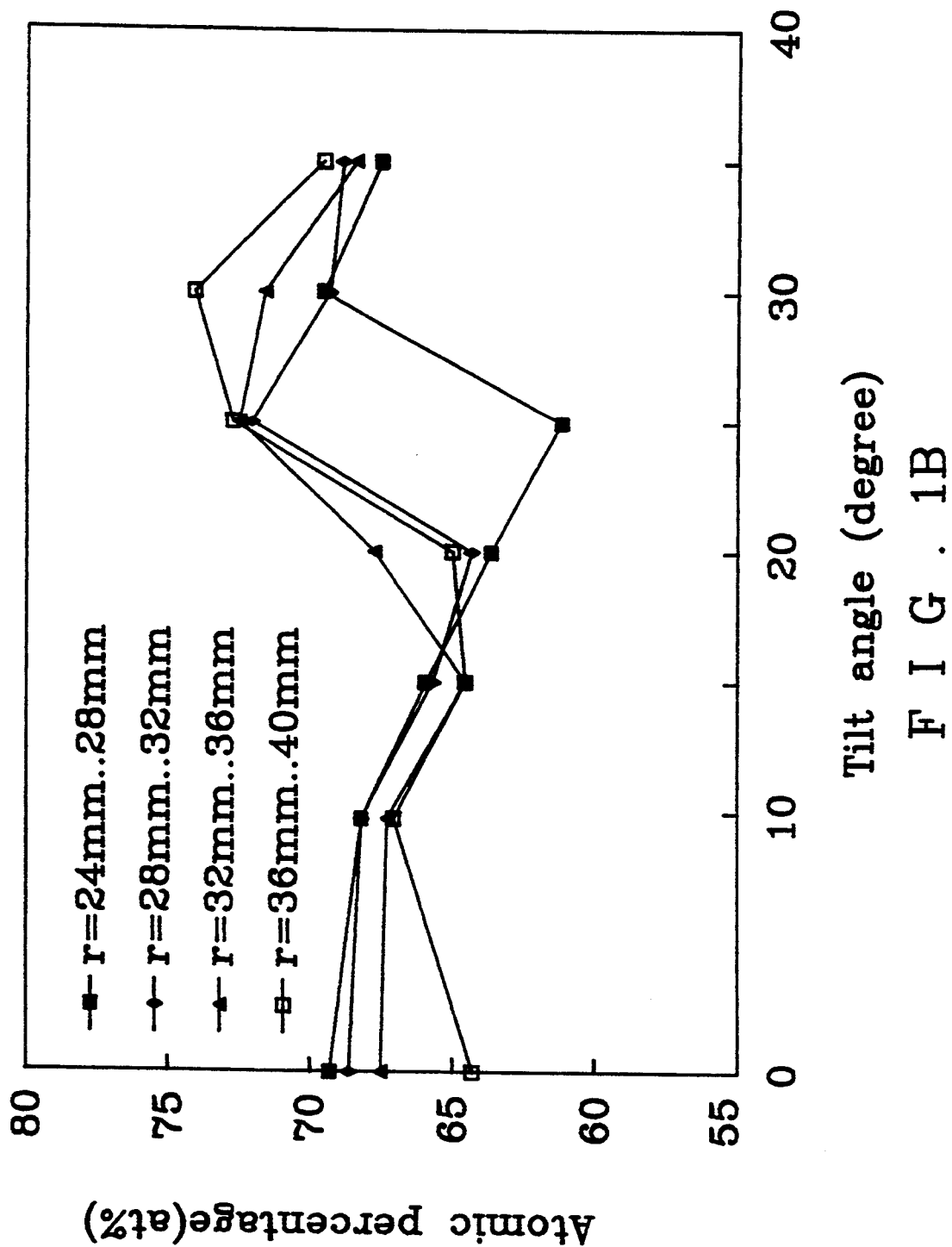
FIG. 1b is a graph depicting the average composition distributions of the element Fe coated at different radiuses on the disk substrate at different sputtering tilt angles.

FIG. 1b is a graph depicting the different distributions of the element Fe coated at different radiuses on the disk substrate at different sputtering tilt angles. The distributions of the coated element Fe are also measured the different radius ranges 24 mm-28 mm, 28 mm-32 mm, 32 mm-36 mm, and 36 mm-40 mm along the inner radius to the outer radius of the disk substrate respectively, In the drawing, the X-axis represents the sputtering tilt angle, while the Y-axis represents the atomic percentage of the element Fe. The distribution of the element Fe coated on the substrate varies with the sputtering tilt angle during sputtering operation.

Figure 1C:
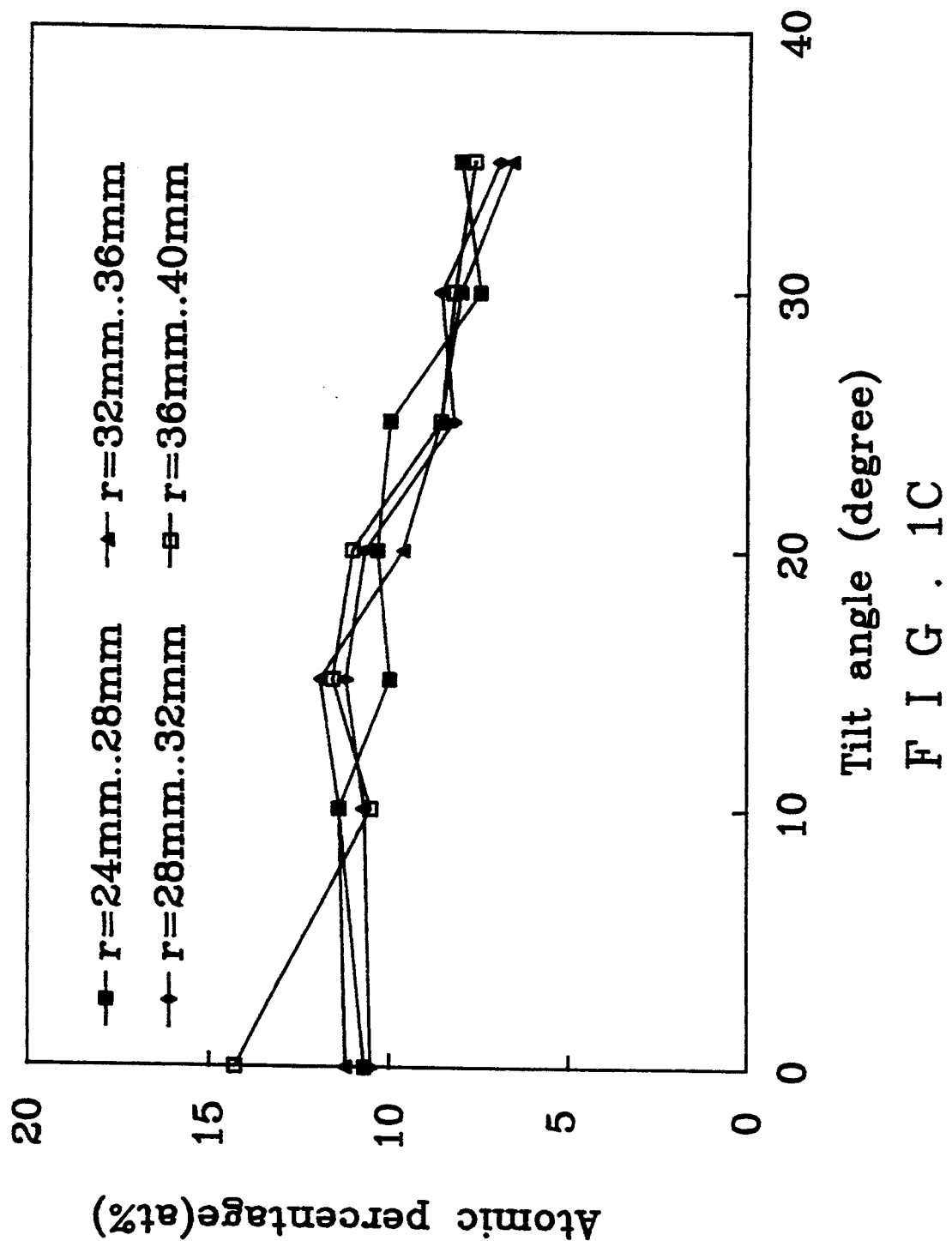
FIG. 1c is a graph depicting the average composition distributions of the element Co coated at different radiuses on the disk substrate at different sputtering tilt angles.

FIG. 1c is a graph depicting the different distributions of the element Co coated at different radiuses on the disk substrate at different sputtering tilt angles. The distribution of the coated element Co is also measured from the different radius ranges 24 mm-28 mm, 28 mm-32 mm, 32 mm-36 mm, and 36 mm-40 mm along the inner radius to the outer radius of the disk substrate respectively. In the drawing, the X-axis represents the sputtering tilt angle, while the Y-axis represents the atomic percentage of the element Co. The distribution of the element Co coated on the substrate varies with the sputtering tilt angle during sputtering operation.

The three elements Tb, Fe, Co commonly form the compositions of the recording medium of the present invention. From the distributions of the elements Tb, Fe, and Co on the disk substrate described above, it is found that the disk may get the best distribution when the disk is sputtered around a tilt angle of 15 degrees. That is, the distribution of the composition coated on the disk substrate is the most uniform when the magneto-optical recording medium is sputtered onto the disk at sputtering tilt angle about 15 degrees.

Figure 2:
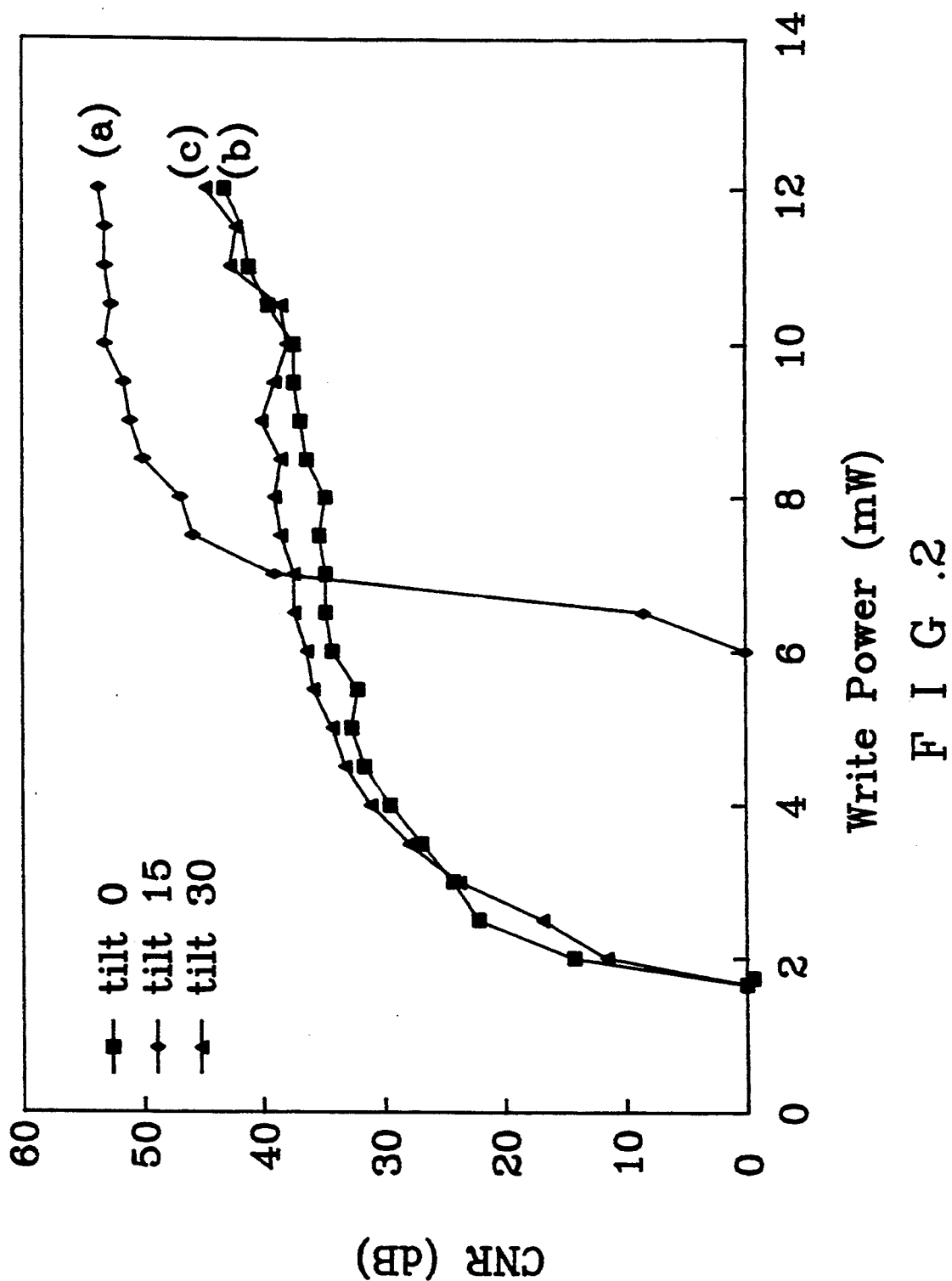
FIG. 2 is a graph depicting the carrier to noise ratio versus the write power of the disk sputtered at sputtering tilt 0, 15, and 30 degrees respectively.

In order to test the characteristics of the disk sputtered at different tile angles, three magneto-optical disks sputtered at sputtering tilt angles 0, 15, and 30 degrees respectively are prepared for test. Referring to FIG. 2, which is a graph depicting the carrier to noise ratio(abbreviated CNR) versus the write power of the disk. In the drawing, the X-axis represents the write power (mW) supplied to the disk when testing, while the Y-axis represents the carrier to noise ratio (dB) of the disk being tested. After test, three characteristic curves a, b, and c are obtained. The curve b is the characteristic curve of the disk sputtered at a tilt angle of 0 degree. The curve c is the characteristic curve of the disk sputtered at a tilt angle of 30 degrees. Comparing the three characteristic curves of the disk sputtered at different tilt angles, it is found that the disk substrate sputtered at a tilt angle of 15 degrees may get a higher carrier to noise ratio and write threshold power.

Based upon the conditions and knowledges above, an apparatus for coating a magneto-optical recording medium film onto a magneto-optical disk substrate is provided for forming the magneto-optical recording medium film on the disk is disclosed, forming a preferred embodiment of the present invention. The present invention will be described in more detail by the preferred embodiment and comparison below.

FIRST EMBODIMENT

Figure 4:
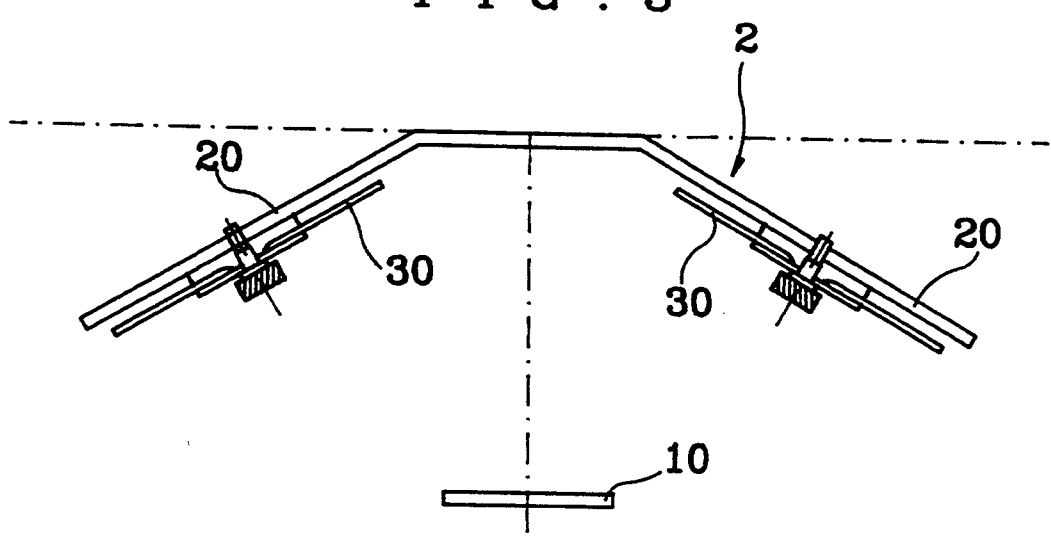
FIG. 4 illustrates the sectional view of FIG. 3, which shows the disk substrates are mounted on the clamper of the clamping mechanism, and each disk substrate is set with respect to the plane of the sputtering gun at a tilt angle of 15 degrees.

First of all, prepare a Tb, Fe, Co magneto-optical sputtering target containing 100% intermetallic compound composition and then place the sputtering target in a D.C. sputtering gun 10 in a horizontal manner. In the present invention, the sputtering gun 10 (as shown in FIG. 4) is served as a base for the magneto-optical recording medium supplying device, and functioned as a sputtering power supplying source and a cooling device for the sputtering target. The sputtering processes according to the present invention is done in a closed vacuum space having a casing for isolating the outer space and the vacuum space. At first, the closed vacuum space is pumped to a vacuum of about $10^{-6}$ tort, and then filled with inert gas Ar. The pressure in the vacuum space should be maintained to $10^{-3}$ tort during sputtering operation.

Figure 3:
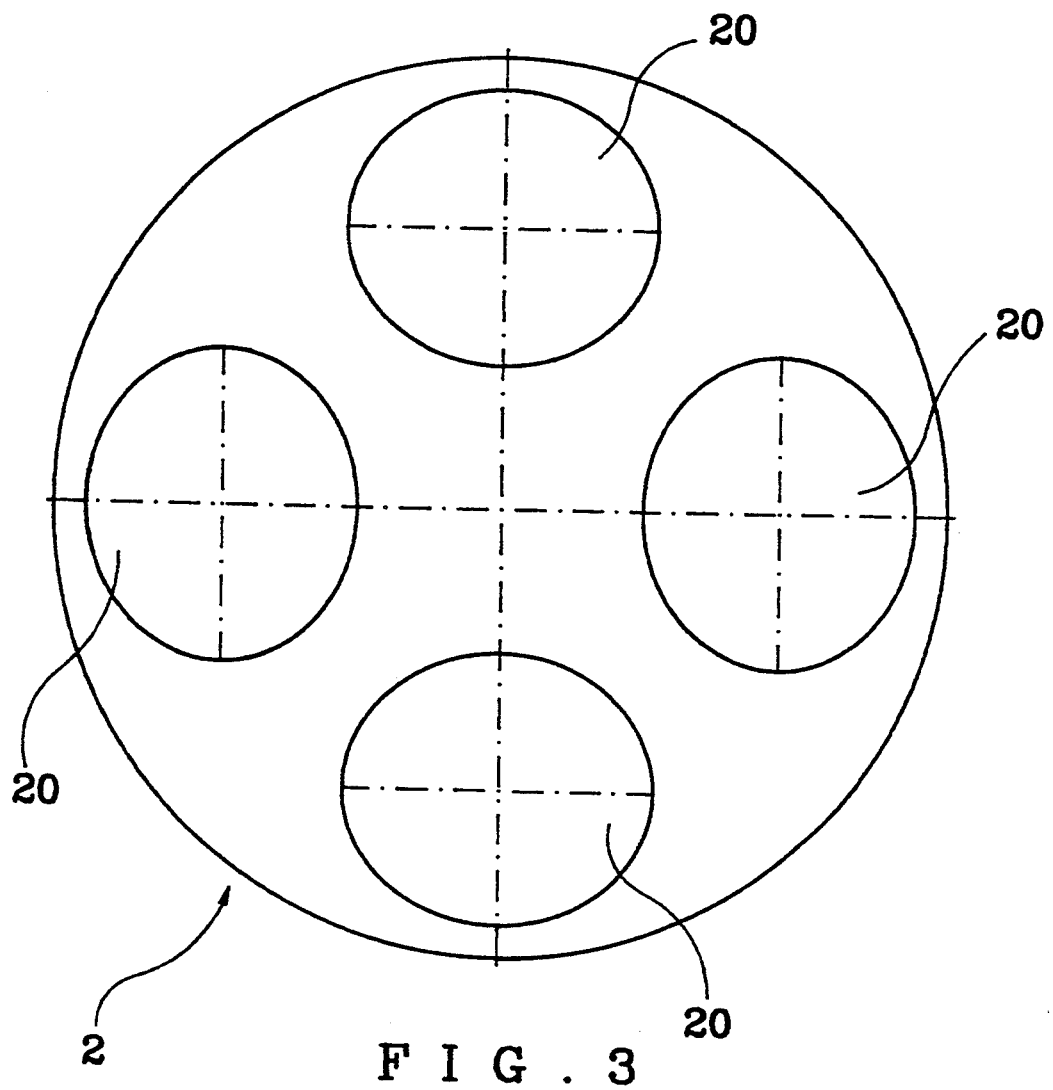
FIG. 3 illustrates a top plane view of the clamping mechanism capable of clamping four disk substrates to be sputtered in accordance with the preferred embodiment of the present invention.

Thereafter, prepare a clamping mechanism 2 consisting of a plurality of clampers 20 as illustrated in FIG. 3 and FIG. 4. Each of the clampers 20 is functioned as a fixing device for clamping a disk substrate to be sputtered, and then fix the disk substrate 30 coated with an under-coat film on the clamper 20 in position. Each clamper 20 of the clamping mechanism 2 is designed to have an oblique angle to the sputtering gun 10, so that the plane surface of the disk substrate clamped on the clamper 20 with respect to the sputtering gun 10 at a proper tilt angle, for example 15 degrees. The arrangement as illustrated in FIG. 3 and 4 is designed to manufacture 3.5" magneto-optical disk. In the preferred embodiment of the present invention, a magneto-optical sputtering target with 2" diameter can simultaneously sputter four 3.5" magneto-optical disks.

During the sputtering processes, the clamping mechanism 2 rotates about the axial center thereof illustrately indicated by numeral 40. At the same time, every disk 30 respectively rotates about the axial center of the clamper 20 where the disk is mounted. The rotation is indicated by numeral 50 as shown.

During the sputtering operation, the distance between the sputtering target and the read/write area of the disk is kept in a proper distance about 5-10 cm in order to preferably control the uniformity of the magneto-optical recording medium film on the disk substrate. In the preferred embodiment of the present invention, the carrier to noise ratio of the disk described above is maintained over 50 dB, the whole clamping mechanism rotates at a speed of 10 rpm and each clamper of the clamping mechanism rotates about its axial center at a speed of 40 rpm. The sputtering gun is supplied with electrical power over 50 W. In this manner, the cover-coat and reflecting layer is coated onto the disk substrate after the coating of the magneto-optical recording medium film.

COMPARISON EMBODIMENT

In order to prove the quality of product manufactured by the present invention, a comparison embodiment is provided for test. To prepare the comparison embodiment, another set of magneto-optical disk is manufactured and sputtered according to the processes as that of the first embodiment of the present invention described above, except for the oblique angle arrangement between the sputtering target and the disk substrate. That is, in the comparison embodiment, each clamper of the clamping mechanism is arranged parallel to the sputtering gun, rather than oblique to the sputtering gun at a tilt angle. So, the plane surface of the disk substrate clamped on the clamper will be parallel to the sputtering gun. In such an arrangement, the disk substrate of the comparison embodiment is prepared for the following test.

To compare the differences between the comparison embodiment and the first embodiment, we insert the sample disks of the first embodiment and the comparison embodiment respectively into a magneto-optical drive. Then, rotate the the sample disks with the magneto-optical drive at a speed of 1800 rpm, and measure the CNR value of the two disks respectively under the following conditions:

Carrier Frequency: 2.9 MHz
Writing Biase field: −400 Oe
Pulse Width: 120 nsec

The comparison result is shown in FIG. 2 which depicts the carrier to noise ratio versus the write power of the disk sputtered at different tilt angles. In the drawing, the curve b is the characteristic curve of the disk manufactured by the comparison embodiment, which the disk is sputtered at a tilt angle of 0 degree. The curve a in FIG. 2 is the characteristic curve of the disk manufactured by the first embodiment, which the disk is sputtered at a tilt angle of 15 degrees. Comparing the two characteristic curves a and b, within the ranges of 5–12 mW of the write power, it is found that the carrier to noise ratio of the first embodiment of the present invention is obviously higher than that of the comparison embodiment, i.e. the conventional magneto-optical disk.

SECOND EMBODIMENT

Prepare a $Tb_{21}Fe_{67}$ and $Co_{12}$ sputtering target containing 100% intermetallic compound composition, and then coat a magneto-optical recording medium film on a 3.5" disk substrate at a sputtering tilt angle of 15 degrees for 1–3 minutes. Thereafter, the features of the sputtered disk of this embodiment is tested same to the processes of the first embodiment described above. The tested result shows that the recording medium film coated on the surface of the disk substrate contains element Tb about 24% as shown in FIG. 1a, and the value of CNR thereof ranges from 46 dB–52 dB as shown in FIG. 2. It is to be understood that the present invention may employ a sputtering target containing less element Tb than prior arts. As a result, it is possible to reduce the cost of manufacturing the sputtering target.

Further, it is found that the present invention is especially suitable for sputtering the magneto-optical recording medium film onto a smaller disk substrate. The reasons are that the smaller disk substrate has a relatively narrow read/write area, so that it is easily to control the thickness and distribution of the recording medium film on the disk substrate during sputtering processes. In additions, it is possible to proceed the sputtering processes to a plurality of smaller disk substrates simultaneously. For instance, when a magneto-optical disk with a diameter of 2.5" or 2" is processed, a sputtering target with diameter of 2" can process 6 to 8 disks simultaneously. Consequently, the present invention is deemed much economical than prior art.

In the preferred embodiment of the present invention, the extended axis line of every clamper of the clamping mechanism exactly meets the center point of the sputtering target. In such an arrangement, it may get a better effect.

So far, the feature of the present invention has been described. It will be obvious to those skilled in the art to use this invention according to the above detailed description. While the arrangement herein described constitutes a preferred embodiment of this invention, it is to be understood that various changes and modifications may be made therein without departing from the scope and spirit of the invention as defined in the appended claim.

I claim:

1. An apparatus for simultaneously coating a film of magneto-optical recording medium uniformly onto a plurality of magneto-optical disk substrates with a sputtering target, said apparatus comprising:
    (a) clamping means for clamping a plurality of said magneto-optical disk substrates thereon, said clamping means comprising a base and a semi-conical extension from said base, said base being substantially parallel to a plane containing said sputtering target and disposed directly thereabove, said clamping means having a first central axis pointing through a center of said base and perpendicular to said base, wherein said semi-conical extension having an inner surface, which comprises a plurality of clamper means each of said clamper means being adapted to hold one of said plurality of magneto-optical disk substrates on said inner surface in a parallel relationship with respect to said inner surface, and each of said magneto-optical disk substrates having a second central axis perpendicular to said magneto-optical disk substrate and pointing through a center thereof;
    (b) first rotating means for rotating said clamping means about said first central axis; and
    (c) a second rotating means provided with each of said clamper means for rotating each of said magneto-optical disk substrates about a respective said second central axis;
    (d) wherein said inner surface of said semi-conical extension being disposed at an angle between 10 and 20 degrees with respect to said plane containing said sputtering target.

2. An apparatus for simultaneously coating a film of magneto-optical recording medium uniformly onto a plurality of magneto-optical disk substrates as claimed in claim 1, wherein said sputtering target contains intermetallic compound.

3. An apparatus for simultaneously coating a film of magneto-optical recording medium uniformly onto a plurality of magneto-optical disk substrates as claimed in claim 1, wherein said rotating means comprising a driving means for rotating each of the magnetic-optical disk substrates about said second axis.

4. An apparatus for simultaneously coating a film of magneto-optical recording medium uniformly onto a plurality of magneto-optical disk substrates as claimed in claim 1, wherein said sputtering target and said base sharing the same said first central axis such that said first rotating means causing said magneto-optical disk substrates that are clamped on said clamping means to rotate also about said sputtering target.

5. An apparatus for simultaneously coating a film of magneto-optical recording medium uniformly onto a plurality of magneto-optical disk substrates as claimed in claim 1, wherein said sputtering target containing Tb, Fe, and Co.

6. An apparatus for simultaneously coating a film of magneto-optical recording medium uniformly onto a plurality of magneto-optical disk substrates as claimed in claim 1, wherein said sputtering target containing 20 to 22% Tb.

7. An apparatus for simultaneously coating a film of magneto-optical recording medium uniformly onto a plurality of magneto-optical disk substrates as claimed in claim 1, wherein said semi-conical extension being disposed at an angle of about 15 degrees with respect to said plane containing said sputtering target.

* * * * *